United States Patent [19]

Muramoto

[11] Patent Number: 4,794,347
[45] Date of Patent: Dec. 27, 1988

[54] AMPLIFIER CIRCUIT HAVING CROSSOVER SWITCHING FEATURES

[75] Inventor: Tomotaka Muramoto, Tokyo, Japan

[73] Assignee: Canon Kabushiki Kaisha, Tokyo, Japan

[21] Appl. No.: 51,323

[22] Filed: May 19, 1987

[30] Foreign Application Priority Data

May 21, 1986 [JP] Japan .................... 61-114912
May 21, 1986 [JP] Japan .................... 61-114916
May 21, 1986 [JP] Japan .................... 61-114917
May 21, 1986 [JP] Japan .................... 61-114932

[51] Int. Cl.$^4$ ............................................. H03F 1/14
[52] U.S. Cl. .......................................... 330/51; 330/69; 330/255
[58] Field of Search ................ 330/9, 51, 69, 267, 330/270, 273, 310, 311, 255

[56] References Cited

U.S. PATENT DOCUMENTS

| | | | |
|---|---|---|---|
| 4,105,942 | 8/1978 | Henry | 330/69 X |
| 4,109,308 | 8/1978 | Rödel | 330/9 X |
| 4,138,649 | 2/1979 | Schaffer | 330/51 X |
| 4,438,408 | 3/1984 | Skrovanek et al. | 330/51 |
| 4,510,459 | 4/1985 | Guisinger | 330/255 X |
| 4,562,405 | 12/1985 | Hansen et al. | 330/51 |

Primary Examiner—Eugene R. LaRoche
Assistant Examiner—Steven J. Mottola
Attorney, Agent, or Firm—Fitzpatrick, Cella, Harper & Scinto

[57] ABSTRACT

There is disclosed an amplifier unit, provided with a first amplifier for amplifying a first input signal, a second amplifier for amplifying a second input signal, a pair of switches for respectively switching the output of the first amplifier and that of the second amplifier to selectively release either output, and third and fourth amplifiers for respectively amplifying the outputs of the pair of switches to supply the outputs to a pair of loads, thereby avoiding fluctuation in bias state and formation of transient current at the switching operation.

14 Claims, 4 Drawing Sheets

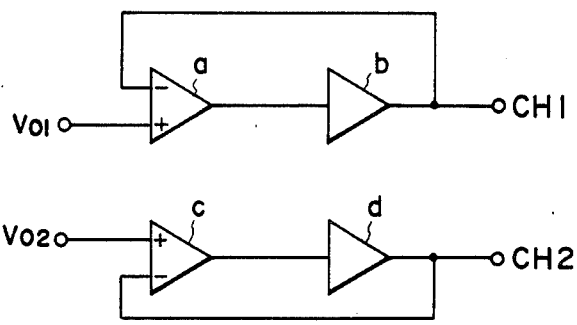
F I G. 2A
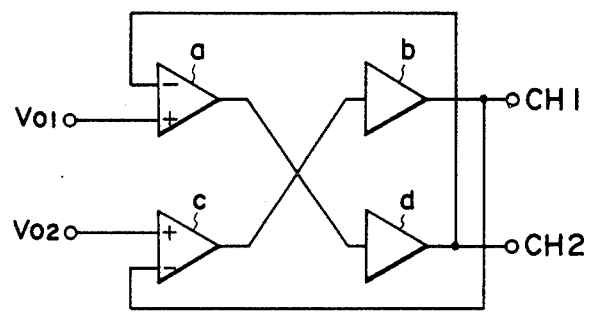
F I G. 2B
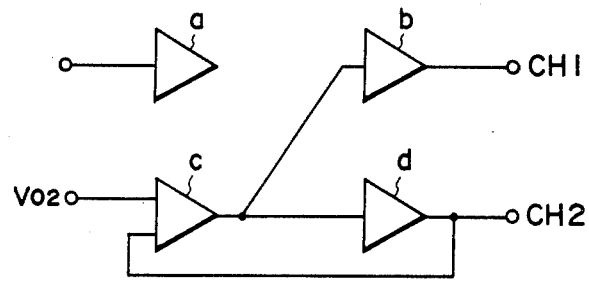
F I G. 2C

AMPLIFIER CIRCUIT HAVING CROSSOVER SWITCHING FEATURES

BACKGROUND OF THE INVENTION

1. Field of the Invention

The present invention relates to an amplifier, and more particularly to an amplifier adapted for use in a circuit for controlling signals to be supplied to a recording head.

2. Related Background Art

At first there will be explained conventional magnetic recording apparatus employing such amplifier while making reference to FIGS. 3A and 3B, wherein shown are an input signal $v_{01}$; a buffer amplifier a0; a switch SWa; driving amplifiers b0, c0; terminals CH1, CH2 to be onnected to magnetic heads constituting loads; and a capacitor Ca.

In case of recording a first field of an image signal in the circuit shown in FIG. 3A, the switch SWa is so connected as to supply the signal from the buffer amplifier a0 to the driving amplifier b0, so that the input signal $v_{01}$ is supplied to the recording head connected to the terminal CH1. In recording a second field, the switch SWa is so shifted as to supply the signal from the buffer amplifier a0 to the driving amplifier c0, whereby the input signal $v_{01}$ is supplied to the recording head connected to the terminal CH2.

In the circuit shown in FIG. 3B, the capacitor Ca is inserted between the buffer amplifier a0 and the switch SWa, but the switching operation thereof is conducted in the identical manner as in FIG. 3A.

In the conventional circuit shown in FIG. 3A, the input terminal of the driving amplifier b0 or c0 is either connected to the buffer amplifier a0 or left open. Consequently the current supplied to the driving amplifier is different and causes a change in the bias according to the positin of the switch SWa.

As the result, when the magnetic head connected to the terminal CH1 is switched to that connected to the terminal CH2, there will result a transient current because of a change in the bias, so that the initial portion of the second field may not be properly recorded.

In the circuit shown in FIG. 3B, such change in bias does not occur since the buffer amplifier a0 is not connected directly, in an IC circuit, to the driving amplifier b0 or c0.

However, the capacitor Ca is charged by the potential difference across said capacitor, and the accumulated charge flows into a circuit to which the switch SWa is connected, when it is shifted. As the result a transident current is generated when the magnetic head is shifted for recording the second field, so that the initial portion thereof may not be properly recorded.

Also the use of the above-explained analog switch SWa gives rise to the following drawbacks:

(1) Such analog switch generally shows unsatisfactory frequency response for frequencies exceeding several MHz; and (2) A load circuit connected to the driving amplifier, being a relatively large load to the buffer amplifier, shows a deteriorated output characteristic, by the influence of the contact resistance of the analog switch.

It is also considered, as shown in FIG. 3C, to utilize the heads connected to the terminals CH1, CH2 for both recording and erasing, and to select the signals to be supplied to said head by means of a switch SWb.

In the circuit shown in FIG. 3C, the recording signal $v_s$ and the erasing signal $v_e$ are selected by the switch SWb.

Said switch SWb may be eliminated in a circuit shown in FIG. 3D, wherein the recording signal $v_s$ and the erasing signal $v_e$ are respectively amplifier by buffer amplifier d0, e0 and are added through resistors R1, R2. Thus, said signals are supplied to a buffer amplifier f0 through the permanently connected adding circuit. In the recording operation the recording signal $v_s$ alone is supplied, and, in the erasing operation the erasing signal $v_e$ alone is supplied. The input signal is supplied to the the terminal CH1 or CH2 through the switch SWb and a driving amplifier g0 or h0.

However the conventional circuits shown in FIGS. 3C and 3D are associated with the following drawbacks.

The circuit shown in FIG. 3C is associated with the drawbacks that:

(1) the frequency characteristic of the recording signal $v_s$ deteriorates in passing through the switch SWb; and (2) distortion will result due to the presence of the switch SWb.

The the circuit shown in FIG. 3D includes a drawback that the S/N ratio of the recording signal $v_s$ deteriorates by the noise introduced from the input circuit of the erasing signal $v_e$.

Also FIGS. 3E to 3G show examples of an amplifier for adding and amplifying plural input signals, wherein shown are input signals $v_1$, $v_2$, $v_3$; transistors Q1-Q3, Qd, Qe; capacitors C1-C3, Ca, Cb, Cc: resistors R1-R9, Ra, Rb, Rc, Rd, Re, Rg, Rh; and a driving circuit 1, for example for a magnetic recording system.

In the circuit shown in FIG. 3E, the input signal $v_1$ is supplied, through the capacitor C1, to the base of the transistor Q1 and to the resistors R1, R2. The other end of the resistor R1 is connected to a constant voltage source Vcc, and the other end of the resistor R2 is grounded. The collector of said transistor Q1 is connected to the constant voltage source Vcc, and the emitter thereof is connected to the resistor R3 and to the resistor Ra through the capacitor Ca. The other end of said resistor R3 is grounded. Consequently the signal $v_1$ is transmitted through a buffer amplifier consisting of the transistor Q1 and the resistors R1, R2 and R3, and is released from the emitter of the transistor Q1 to the resistor Ra through the capacitor Ca. Similarly the signal $v_2$ is supplied through the capacitor C2, transmitted through a buffer amplifier consisting of the transistor Q2 and the resistors R4, R5 and R6, and released from the emitter of said transistor Q2 to the resistor Rb through the capacitor Cb. Likewise the signal $v_3$ is transmitted through a buffer amplifier consisting of the transistor Q3 and the resistors R7, R8 and R9, and is relaased from the emitter of said transistor Q3 to the resistor Rc through the capacitor Cc. The other ends of three output resistors Ra, Rb, Rc are mutually connected and are further connected to the base of the transistor Qd.

In the above-explained circuit, three input signals $v_1$, $v_2$, $v_3$ are respectively amplified by buffer amplifiers composed of the transistors Q1, Q2, Q3 and are added at the base of the transistor Qd through the resistors Ra, Rb, Rc.

The output from the emitter of the transistor Qd is supplied to the driving circuit 1 for driving a recording head. It is assumed that the capacitors Ca, Cb, Cc are so selected as to satisfactorily transmit the frequency ranges of the input signals $v_1$, $v_2$ and $v_3$.

In the circuit shown in FIG. 3F, three input signals $v_1$, $v_2$, $v_3$ are likewise amplified respectively by buffer amplifiers composed of the transistors Q1, Q2, Q3 and are transmitted through the resistors Ra, Rb, Rc, but they are mutually added at the emitter of the transistor Qe.

The output from the collector of said transistor Qe is supplied to the driving circuit 1. As explained above, the capacitors Ca, Cb, Cc are so selected as to satisfactorily transmit the frequency ranges of the input signals $v_1$, $v_2$ and $v_3$.

In the circuit shown in FIG. 3G, three input signals $v_1$, $v_2$ and $v_3$ are amplified by three emitter-grounded amplifiers composed of three transistors Q1, Q2 and Q3 having a common load Rh at the emitters thereof, then mutually added at said common load Rh and are supplied to the driving circuit 1.

However the conventional circuits explained above are associated with various drawbacks.

The circuit shown in FIG. 3E is associated with the drawbacks that:

(1) the gains for the input signals $v_1$, $v_2$, $v_3$ are determined respectively as:

Ra/(Ra+Rb+Rc), Rb/(Ra+Rb+Rc), Rc/(Ra+Rb+Rc) and cannot be independently regulated;

(2) a separate amplifying circuit is required for obtaining a desired gain, since the gain in this circuit is less than 1 for the input signal $v_1$, $v_2$ or $v_3$.

The circuit shown in FIG. 3F is associated with the drawbacks that:

(1) though the gains for the input signals $v_1$, $v_2$, $v_3$ are respectively determined by Rg/Ra, Rg/Rb and Rg/Rc and are therefore independently regulable, the frequency characteristic tend to deteriorate when the gain is increased, since the output is obtained from the collector of the transistor Qe; and (2) since the output is obtained from the collectr of the transistor Qe, the output characteristic is deteriorated when a large load such as a driving circuit for a recording head is connected.

The circuit shown in FIG. 3G is associated with the drawbacks that:

(1) though the output gains for the input signals $v_1$, $v_2$, $v_3$ are respectively defined by Rh/R3, Rh/R6 and Rh/R9 and, therefore, can be regulated independently, the frequency characteristic is insufficient because of the use of the emitter-grounded amplifiers; and (2) since the output is obtained from the collector of the transistor, the output characteristic deteriorates when a large load such as a driving circuit for a recording head is connected.

SUMMARY OF THE INVENTION

An object of the present invention is to resolve the drawbacks encountered in the conventional amplifiers shown in FIGS. 3A to 3G, and particularly those encountered with head switching.

Another object of the present invention is to prevent the deterioration in the frequency characteristics of the output signal caused by the switch shown in FIGS. 3A or 3C.

Still another object of the present invention is to prevent the deterioration of the output characteristics, caused by the contact resistance of the switch when a driving amplifier is connected as a load.

The foregoing objects can be achieved according to the present invention by a feedback amplifier in which the switch is incorporated in a feedback loop.

Still another object of the present invention is to provide an amplifier free from transient current when the loads are switched.

Also in consideration of the drawbacks of the conventional circuits shown in FIGS. 3C and 3B, still another object of the present invention is to provide an amplifier free from the deterioration of the output characteristics caused by the presence of a switching means for selecting two input signals, or by the noise introduced through an input terminal.

The foregoing objects can be achieved, according to a preferred embodiment of the present invention, by an amplifier which is provided with first amplifier means for amplifying a first input signal, second amplifier means for amplifying a second input signal, a pair of switching means for selectively releasing the output of said first amplifier means and that of said second amplifier means, and third and fourth amplifier means for amplifying the outputs of said pair of switching means and supplying the outputs to a pair of loads, whereby two input signals can be selectively supplied by means of a pair of switching means for giving output signals to a pair of loads on time-divided basis, thereby reducing the number of switching means which the signals have to pass and improving the output characteristics.

Furthermore, in consideration of the drawbacks of the conventional circuits shown in FIGS. 3E to 3G, still another object of the present invention is to provide an amplifier capable of independently regulating the gains for plural input signals and providing a satisfactorily flat frequency characteristic over a desired frequency range.

Still another object of the present invention is to provide an amplifier free from deterioration of output characteristics even when a large load is connected.

These objects can be achieved by a preferred embodiment of the present invention by an amplifier capable of adding plural input signals, wherein the input stage is formed with a low impedance to prevent the mutual interference of plural input signals and wherein the structure of a feedback amplifier is employed to prevent the deterioration of frequency characteristics, thereby stabilizing the bias and preventing the deterioration of output characteristics.

Still other objects of the present invention, and the advantages thereof, will become fully apparent from the following description which is to be taken in conjunction with the attached drawings.

BRIEF DESCRIPTION OF THE DRAWINGS

FIGS. 2A, 2B and 2C are block diagrams showing various status of the circuit shown in FIG. 1;

DETAILED DESCRIPTION OF THE PREFERRED EMBODIMENTS

Now the present invention will be clarified in greater detail by embodiments thereof shown in the appended drawings.

Figure 1:
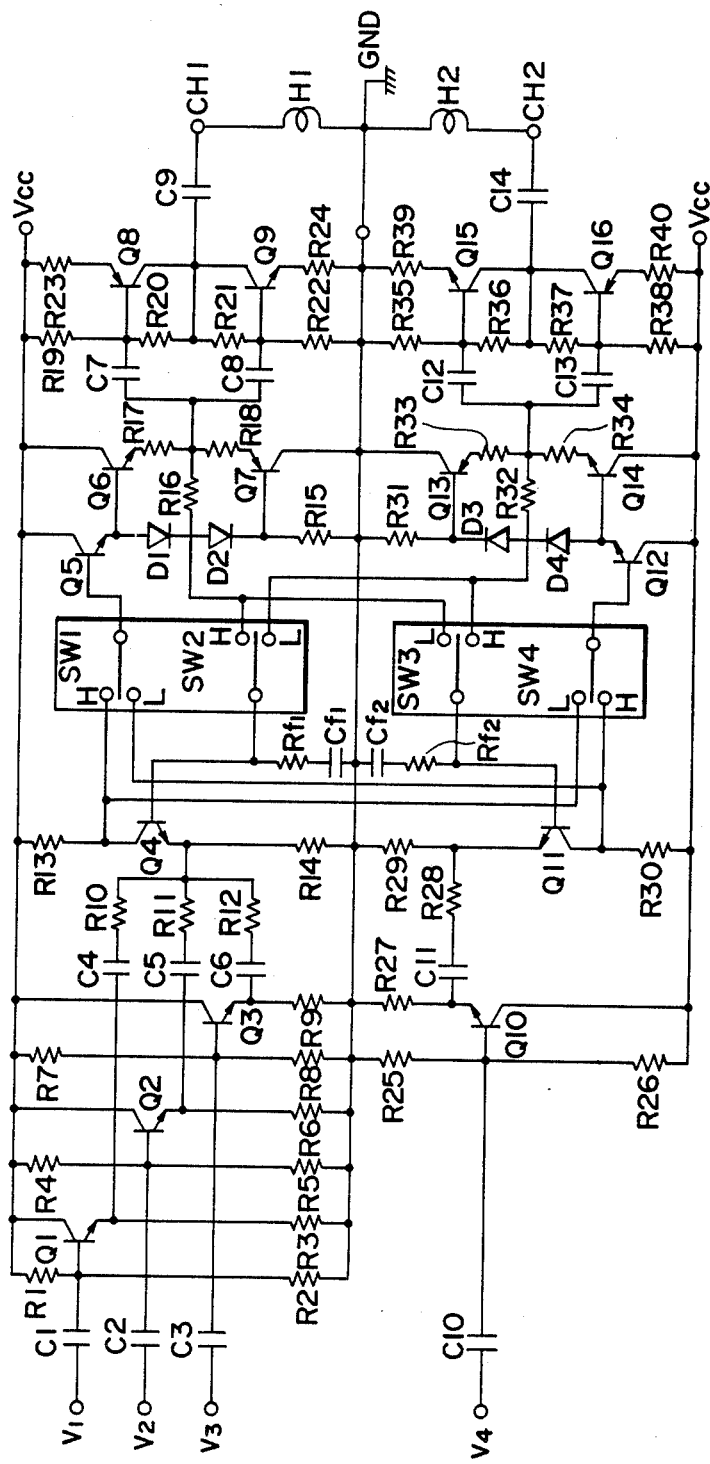
FIG. 1 is a circuit diagram showing an embodiment of the present invention.
Figure 3A:
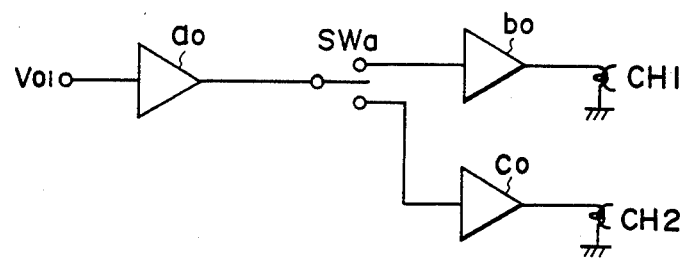
FIGS. 3A, 3B, 3C, 3D, 3E and 3G are block diagrams showing conventional circuits.
Figure 3B:
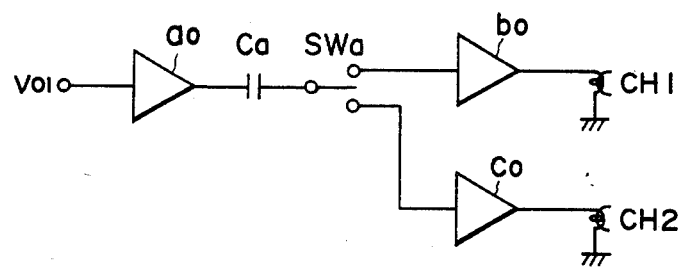
Figure 3C:
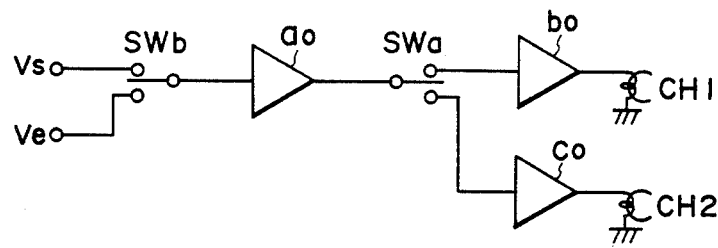
Figure 3D:
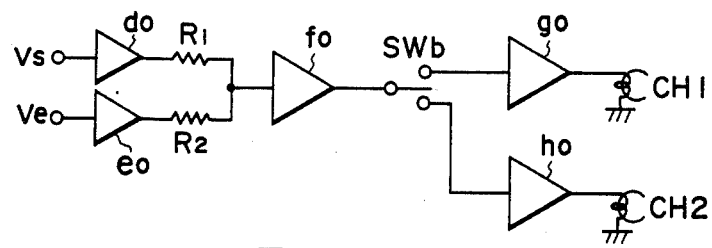
Figure 3E:
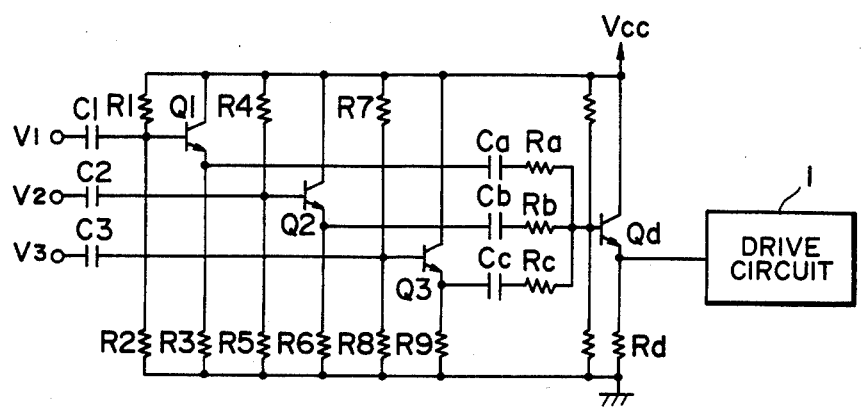
Figure 3F:
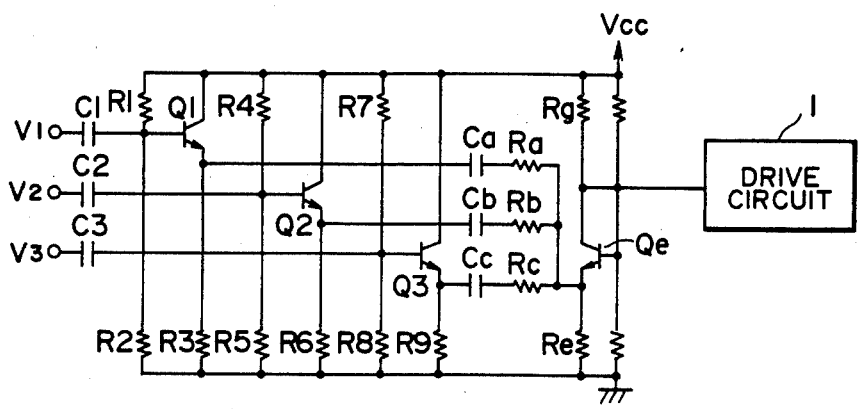
Figure 3G:
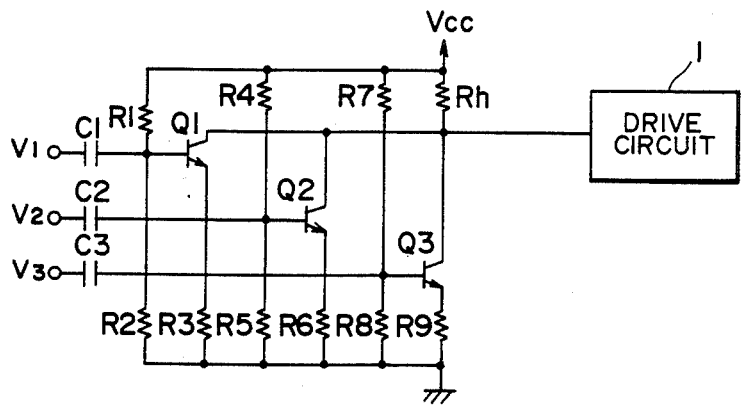

FIG. 1 is a circuit diagram of an embodiment in which the amplifier of the present invention is applied to an apparatus for magnetic recording and erasure with plural heads. It is to be understood, however, that this is merely an example and that the present invention is not limited to such embodiment.

In FIG. 1 there are shown transistors Q1-Q16; capacitors C1-C14, $C_{f1}$, $C_{f2}$; resistors R1-R40, $R_{f1}$, $R_{f2}$; analog switches SW1-SW4; diodes D1-D4; input signals $v_1$-$v_4$; terminals CH1, CH2 to be connected to magnetic heads H1, H2 constituting loads switching operation of the switches SW1-SW4 are controlled by switch control circuit (CNT) which is not shown. The CNT has a switch Field/Frame SW for switching between a field mode and a frame mode, a record switch REC SW for triggering recording operation, an erasing switch ERASE SW for triggering supplying the heads H1, H2 with an erasing current for erasing already recorded signals, and controls for switching the switches SW1-SW4 in response to the operation of the switches Field/Frame SW, REC SW, ERASE SW by an operator.

In the present embodiment, the input signal $v_1$ is introduced through the capacitor C1 and supplied to the base of the transistor Q1 and to the resistors R1, R2. The other end of the resistor R1 is connected to a cconstant voltage source Vcc, and the other end of the resistor R2 is grounded. The collector of the transistor Q1 is connected to said constant voltage source Vcc, and the emitter thereof is connected through the resistor R3 and the capacitor C4 to the resistor R10. The other end of the resistor R3 is grounded. Consequently the signal $v_1$ is transmitted through a buffer amplifier consisting of the transistor Q1 and the resistors R1, R2, R3 and is released, from the emitter of the transistor Q1, through the capacitor C4 to the resistor R10. Similarly the signal $v_2$ is introduced through the capacitor C2, transmitted by a buffer amplifier consisting of the transistor Q2 and the resistors R4, R5, R6 and is released from the emitter of the transistor Q2 through the capacitor C5 to the resistor R11. Likewise the signal $v_3$ is transmitted by a buffer amplifier consisting of the transistor Q3 and the resistors R7, R8, R9, and is released, from the emitter of the transistor Q3, through the capacitor C6 to the resistor R12. The other ends of three output resistors R10, R11, R12 are mutually connected and bonded to the emitter of the transistor Q4 and the resistor 14, of which the other end is grounded. The collector of the transistor Q4 is connected to the resistor R13, an H-terminal of theanalog switch SW1 and an L-terminal of the analog switch SW4. The other end of said resistor R13 is connected to the constant voltage source Vcc. Also the base of the transistor Q4 is connected to a selecting terminal of the analog switch SW2 and the resistor $R_{f1}$ of which the other end is grounded through the capacitor $C_{f1}$.

The selecting terminal of the analog switch SW1 is connected to the base of the transistor Q5, of which collector is connected to the constant voltage source Vcc and the emitter is connected to the base of the transistor Q6 and, through the diodes D1, D2 to the base of the transistor Q7 and the resistor R15 of which the other end is grounded.

The collector of the transistor Q6 is connected to the constant voltage source Vcc, and the collector of the transistor Q7 is grounded.

The emitter of the transistor Q6 is connected to the resistor R17 of which the other end is connected to the resistors R16, R18 and the capacitors C7, C8. The other end of the resistor R18 is connected to the emitter of the transistor Q7. The resistor R16 constitutes a feedback resistor of which the other end is connected to an H-terminal of the analog switch SW2 and an L-terminal of the analog switch SW3.

The above-mentioned transistor Q4 and amplifiers Q5-Q7 constitute a feedback amplifier involving the analog switches SW1, SW2.

More specifically the output of said transistor Q4 is obtained from the collector thereof through the switch SW1, is transmitted through the transistors Q5, Q6 and is fed back from the emitter of the transistor Q6 to the base of the transistor Q4.

The other end of the above-mentioned capacitor C7 is connected to the base of the transistor Q8 and to the resistors R19, R20. The other end of the resistor R19 is connected to the constant voltage source Vcc, and the other end of the capacitor C8 is connected to the base of the transistor Q9 and to the resistors R21, R22. The other end of the resistor R22 is grounded. The other ends of said resistors R20, R21 are connected mutually and further to the collectors of the transistors Q8, Q9 constituting a load driving amplifier and connected, through the capacitor C9, to the terminal CH1 for the load H1.

The input signal $v_4$ is introduced, through the capacitor C10, to the base of the transistor Q10, which constitutes a buffer amplifier with the resistors R25 R26, and R27, in a similar manner as the above-explained transistors Q1, Q2 and Q3.

The emitter of the transistor Q10 is connected, through the capacitor C11 and the resistor R28, to the emitter of the transistor Q11 and is grounded through the resistor R29. The collector of said transistor Q11, corresponding to the amplifier of the transistor Q4, is connected to the resistor R30, an H-terminal of the analog switch SW4 and an L-terminal of the switch SW1. The other end of the resistor R30 is connected to the constant voltage source Vcc. The base of the transistor Q11 is grounded through the resistor $R_{f2}$ and the capacitor $C_{f2}$, and is connected to the selecting terminal of the analog switch SW3.

The selecting terminal of the analog switch SW4 is connected to the base of the transistor Q12. The amplifying circuit composed of the transistors Q12, Q13, Q14 corresponds to that composed of the transistors Q5, Q6, Q7, and the resistor R32 corresponding to the feedback resistor R16 functions likewise as a feedback resistor and is connected to an H-terminal of the analog switch SW3 and an L-terminal of the switch SW2. Thus the amplifier circuit of the transistors Q11, Q12-Q14 constitutes a feedback amplifier incorporating the analog switches SW4, SW3, in a similar as the amplifier circuit of the transistors Q4, Q5-Q7 explained above.

Also the capacitors C12, C13, corresponding to the capacitors C7, C8 are connected to a driving amplifier which is composed of the transistors Q15, Q16 and of which output is supplied, through the capacitor C14, to the terminal CH2 for the load H2.

In the following there will be explained the function of the embodiment shown in FIG. 1.

Three input signals $v_1$, $v_2$ and $v_3$ are respectively transmitted by buffer amplifiers composed of the transistors Q1, Q2 and Q3, mutually added in the form of current through the resistors R10, R11 and R12 and introduced to the emitter of the transistor Q4.

The capacitors C4, C5, C6 and $C_{f1}$ are so selected with low impedances as to satisfactorily transmit the input signals $v_1$, $v_2$ and $v_3$.

(1) At first there will be explained a situation "A", in which the analog switches SW1-SW4 are all positioned at the H-terminals by switch control signals.

The collector of the transistor Q4 is connected to the base of the transistor Q5, and the base of said transistor Q4 is connected to the resistor R16. In this state the transistors Q4, Q5, Q6 and Q7 constitute a feedback amplifier having a feedback resistor R16.

In said amplifier, the gain G1 for the input signal $v_1$ is substantially determined by the resistors R10, R13, R16, $R_{f1}$, the input impedance $\gamma_{ib}$ of the emitter of the base-grounded transistor Q4, the input impedance $\gamma_{ie}$ of the base of the transistor Q4 and the contact resistance $\gamma_{s2}$ of the analog switch SW2 in the closed state thereof, according to the following equation:

$$G1 = \frac{\frac{R13}{R10 + \gamma_{ib}}}{1 + \left(\frac{R13}{R10 + \gamma_{ib}}\right)\left(\frac{\gamma_{ie}//R_{f1}}{\gamma_{ie}//R_{f1} + R16 + \gamma_{s2}}\right)}$$

wherein $\gamma_{ie} = h_{fe} \times (R10//R11//R12//R14)$; $\gamma_{ie}//R_{f1}$ represents the synthesized resistance of the parallel connection of $\gamma_{ie}$ and $R_{f1}$; $h_{fe}$ is the current amplification factor of the transistor Q4; and R10//R11//R12//R14 represents the synthesized resistance of the parallel connection of the resistors R10, R11, R12 and R14.

If the values of the resistors R10, R11, R12, R13, R14, R16 and $R_{f1}$ are suitably selected to satisfy relations $\gamma_{ie} >> R8$, $R16 >> \gamma_{s2}$ and $R13 >> \gamma_{ib}$, there is obtained a relation.

$$G1 = \frac{\frac{R13}{R10}}{1 + \frac{R13}{R10}\left(\frac{R_{f1}}{R_{f1} + R16}\right)} = \frac{R13(R_{f1} + R16)}{R10(R_{f1} + R16) + R13 \cdot R_{f1}}$$

Similarly the gains G2, G3 for the input signals $v_2$, $v_3$ are given by:

$$G2 = \frac{R13(R_{f1} + R16)}{R11(R_{f1} + R16) + R13 \cdot R_{f1}}$$

$$G3 = \frac{R13(R_{f1} + R16)}{R12(R_{f1} + R16) + R13 \cdot R_{f1}}$$

As explained above, the selection of a low emitter input impedance for the transistor Q4 allows to independently select the gains G1, G2 and G3 in relatively wide ranges through the selection of the resistors R10, R11, R12 and $R_{f1}$.

Also the frequency characteristic becomes flat over a predetermined range by the presence of a feedback amplifier.

Also the contact resistance of the analog switch SW2 in the closed state is generally frequency dependent, but hardly affects the frequency characteristic of the output of the feedback amplifier in the above-explained circuit structure.

The output of the feedback amplifier principally composed of the transistors Q4, Q5, Q6 and Q7 is supplied through the capacitors C7 and C8, subjected to current amplification by the driving amplifier composed of the transistors Q8 and Q9 and released through the capacitor C9.

On the other hand, the transistors Q11, Q12, Q13, Q14 similarly constitute a feedback amplifier. If the resistors are so selected as to realize conditions R29=R14, R30=R13, R31=R15, R32=R16, R33=R18 and R34=R17, the functioning point of said amplifier becomes equal to that of the amplifier composed of the transistors Q4, Q5, Q6 and Q7, so that the transistors Q4 and Q11 have a mutually equal base potential and mutually equal collector potential. The output of the feedback amplifier composed of the transistors Q11–Q14 is connected to the driving amplifier composed of the transistors Q15 and Q16, but no signal is given to the load H2 when the input signal $v_4$ is absent.

If an input signal $v_4$ (for example an erasing signal) is introduced in this state, it is subjected to voltage amplification of a gain G4 represented by the following equation:

$$G4 = \frac{R13(R_{f1} + R16)}{R28(R_{f1} + R16) + R13 \cdot R_{f1}}$$

and supplied to the load H2 through the driving amplifier composed of the transistors Q15 and Q16.

(2) In the following there will be explained the function in a state "B", in which all the analog switches SW1–SW4 are positioned at the L-terminals by the switch control signals.

In this state the collector and base of the transistor Q4 are respectively connected with the base of the transistor Q12 and the resistor R32. Consequently there is formed a feedback amplifier principally composed of the transistors Q4, Q12, Q13 and Q14. Also the collector and base of the transistor Q11 are respectively connected with the base of the transistor Q5 and the resistor R16, thereby forming a feedback amplifier principally composed of the transistors Q11, Q5, Q6 and Q7.

In this state, three input signals $v_1$, $v_2$ and $v_3$ are added at the emitter of the transistor Q4 and supplied to the load H2 through the feedback amplifier composed of the transistors Q4, Q12, Q33, Q14, the driving amplifier composed of the transistors Q15, Q16 and the capacitor C14, while the input signal $v_4$ is supplied similarly to the load H1 through the capacitor C9. The load H1 receives no signal when the input signal $v_4$ is absent. If the parameters are selected to satisfy the conditions R13=R30, R14=R29, R15=R31, R16=R32, R17=R34, R18=R33, R19=R38, R20=R37, R21=R36, R22=R35, R23=R40, R24=R39, C7=C13, C8=C12 and C9=C14, the load H2 receives a current identical with that supplied to the load H1 in the foregoing state "A". Also the load H1 receives a current identical with that supplied to the load H2 in said state "A".

In said states "A" and "B", the bias state of the transistor Q4 is identical with that the transistor Q11. Consequently switching from the state "A" to "B", or from "B" to "A", does not cause any change in the bias state, so that the load H1 or H2 is kept free from any transident current resulting from such switching operation.

(3) In the following there will be explained the function in a state "C", in which the analog switches SW1 and SW2 are positioned at the L-terminals while the switches SW3 and SW4 are positioned at the H-terminals by the switch control signals.

In this state the collector of the transistor Q11 is connected to hhe bases of the transistors Q5 and Q12, while the base of the transistor Q11 is connected to the resistor R32.

In this state, therefore, a feedback amplifier is composed of the transistors Q11, Q12, Q13 and Q14, and the output of the transistor Q11 is connected to a buffer amplifier composed of the transistors Q5, Q6 and Q7.

Although the load is increased by the presence of the base-grounded amplifier composed of the transistor Q11, the total gain is hardly affected since the feedback path is composed of the transistors Q12, Q13 and Q14. Consequently the load H2 receives a current same as that in the state "B". Also the load H1 receives a current approximately same as that supplied to the load H2, since the base of the transistor Q5 receives the same signal as that supplied to the base of the transistor Q12.

In this state "C", therefore, a same output current as in the state "A" or "B" can be obtained even when the currents are simultaneously supplied to the loads H1 and H2.

FIGS. 2A to 2C are schematic block diagrams of the above-explained embodiment, respectively corresponding to the states "A", "B" and "C".

In these drawings there are shown a differential amplifier a composed of the transistor Q4 shown in FIG. 1; a buffer amplifier b composed of the transistors Q5, Q6 and Q7 shown in FIG. 1; a differential amplifier c composed of the transistor Q11; and a buffer amplifier d composed of the transistors Q12, Q13 and Q14.

In the state shown in FIG. 2A, an input signal $v_{01}$ is supplied to the terminal CH1 through a feedback amplifier in which the output of the buffer amplifier b is fed back to the differential amplifier a, while an input signal $v_{02}$ is supplied to the terminal CH2 through a feedback amplifier in which the output of the buffer amplifier d is fed back to the differential amplifier c.

In the state shown in FIG. 2B, the input signal $v_{01}$ is supplied to the terminal CH2 through a feedback amplifier in which the output of the buffer amplifier d is fed back to the differential amplifier a, while the input signal $v_{02}$ is supplied to the terminal CH1 through a feedback amplifier in which the output of the buffer amplifier b is fed back to the diffrrential amplifier c.

In the state shown in FIG. 2C, the input signal $v_{02}$ is supplied to the terminal CH2 through a feedback amplifier in which the output of the buffer amplifier d is fed back to the differential amplifier c, and the output thereof is supplied to the terminal CH1 through the buffer amplifier b.

In the following there will be explained the function as a magnetic recording apparatus in each state. In case an image signal is supplied as the input signal $v_{01}$ but no signal is supplied as the input $v_{02}$, said image signal is recorded with the head H1 or H2 respectively in the state "A" or "B". Therefore, by switching the state "A" and "B" every 1/60 of a second, it is rendered possible to record the first field with the head H1 and the second field with the head H2. This corresponds to a state in which an operator turns on the REC SW and selects the frame mode by the Field/Frame SW. When the operator selects the field mode, the recording is conducted with a head alone corresponding to the state "A" or "B".

On the other hand, in case an erasing signal is supplied as the input $v_{02}$ but no signal is supplied as the input $v_{01}$, an erasing operation is conducted with the head H2 in the state "A", with the head H1 in the state "B", or with both heads in the state "C". This corresponds to a state in which an operator turns off REC SE and turns on ERASE SW. When the operator selects the field mode by the switch Field/Frame SW, the erasing operation is conducted with a head corresponding to the state "A" or "B", and when the operator selects the frame mode by Field/Frame SW, the erasing operation is conducted simultaneously with the heads H1 and H2.

In the above-explained embodiment, the characteristic of the image signal supplied to the heads does not deteriorate even when both heads H1, H2 are switched, so that satisfactory recording of the image signal can be achieved.

Consequently, even in case of supplying the input signal to plural loads on time-divided basis, it is rendered possible, through feedback amplification, to satisfactorily absorb the influence of the switch means on the frequency characteristics or on the output characteristics.

In the foregoing ebbodiment, the bias states of the transistors Q4 and Q11 do not show any change at the switch over from the state "A" to "B". Consequently no transient current is supplied to the loads at such switching operation.

It is therefore possible to record the image signal of a frame by recording the first field of said image signal in the state "A" and the second field in the state "B".

In this manner, in case of supplying the input signal to a pair of loads through a switching operation, it is rendered possible to avoid the formation of a transient current at such switching operation.

Also in the foregoing embodiment, the switches SW1 and SW4 not only function to select either one of two input signals but also to supply each input signal to the heads on time-divided basis, so that said two input signals can be supplied to each head only during a desired period through the manipulation of switches SW1 and SW4 only.

This is particularly useful in case two heads are used both for recording and for erasing, as the recording or erasing operation in each head can be achieved with a desired timing.

In this manner two input signals can be supplied to two loads, in selective manner, at a desired timing and with satisfactory output characteristics.

Also in the foregoing circuit structure, the input signals $v_1$, $v_2$ and $v_3$ are added at the emitter of the transistor Q4, but the gains for said input signals can be independently regulated since the input impedance of the feedback amplifier containing the transistor Q4 is selected to be small. Also said feedback amplifier has a flat frequency characteristic and a stable output characteristic regardless of the magnitude of the load.

This property is particularly important in case of obtaining a recording signal in which the mixing ratio is important, for example the input signal $v_1$ is an FM-modulated luminance signal and the input signal $v_2$ is an FM-modulated color difference signal.

Also plural input signals can be mixed without mutual interference since the amplifier has a low input impedance, and the gain of amplification can be independently adjusted for each input signal.

Also the use of a feedback amplifier permits providing a flat and stable frequency chaaacteristic even when a heavy load is connected.

What is claimed is:
1. An amplifier comprising:
 (a) first amplifier means for amplifying a first input signal;
 (b) second amplifier means for amplifying a second input signal;

(c) third amplifier means for amplifying a signal input therein and supplying said amplified input signal to a first load;

(d) fourth amplifier means for amplifying a signal input therein and supplying said amplified input signal to a second load;

(e) first switch means for supplying a output of said first amplifier means selectively to said third amplifier means and said fourth amplifier means; and (f) second switch means for supplying an output of said second amplifier means selectively to one of said third amplifier means and said fourth amplifier means, said second switch means operating with said first switch means.

2. An amplifier according to claim 1, wherein said first input signal is a recording signal.

3. An amplifier according to claim 2, wherein said second input signal is an erasing signal.

4. An amplifier according to claim 1 wherein said first amplifier means comprises a transistor.

5. An amplifier according to claim 1, wherein said second amplifier means comprises a transistor.

6. An amplifier according to claim 1, wherein said first and second loads are a pair of magnetic heads.

7. An apparatus comprising:
(a) first amplifier means for independently amplifying input signals;
(b) adding means for adding said input signals amplified by said first amplifier, said amplified input signals being supplied to one terminal of said adding means and a plurality of resistors being connected in common to another terminal of said adding means;
(c) a transistor for amplifying the signal added by said adding means, said signal being supplied to the emitter of said transistor;
(d) buffer means for buffering an output of said transistor;
(e) switching means provided between said transistor and said buffer means; and
(f) means for obtaining a bias from said buffer means and for feeding back said obtained bias to said transistor.

8. An apparatus comprising:
(a) adding means for adding input signals;
(b) a transistor for amplifying the signal added by said adding means, said signal being supplied to the emitter of said transistor;
(c) buffer means for buffering an output of said transistor; and
(d) means for obtaining a bias from said buffer means and for feeding back said obtained bias to said transistor.

9. An apparatus, comprising:
(a) first amplifier means for independently amplifying input signals;
(b) second amplifier means of a low impedance for adding and amplifying said input signals amplified by said first amplifier means;
(c) buffer means for buffering an output of said second amplifier means; and (d) means for obtaining a bias from said buffer means and for feeding back said obtained bias to said second amplifier means.

10. An apparatus comprising:
(a) amplifier means of a low input impedance for adding and amplifying at least two input signals;
(b) buffer means for buffering an output of said amplifier means;
(c) switching means provided between said amplifier means and said buffer means; and
(d) means for obtaining a bias from said buffer means and for feeding back said obtained bias to said amplifier means.

11. An apparatus comprising:
(a) resistors for adding input signals, said input signals being input to one terminal of each resistor and the other terminals of said resistors being connected in common;
(b) a transistor for amplifying the signal added by said resistors, said signal being supplied to an emitter of said transistor;
(c) buffer means or buffering an output of said transistor; and
(d) means for obtaining a bias from said buffer means and for feeding back said obtained bias to said transistor.

12. An apparatus comprising:
(a) amplifier means for amplifying an input signal;
(b) first buffer means for amplifying and outputting a signal which is input therein;
(c) second buffer means for amplifying and outputting a signal which is input therein;
(d) first switch means for supplying an output of said amplifier means selectively to said first and second buffer means; and
(e) second switch means for selectively supplying outputs of said first and second buffer means to said amplifier means.

13. An apparatus comprising:
(a) first amplifier means for amplifying an input signal;
(b) first and second buffer means for amplifying the amplified signal of said first amplifier means;
(c) first switch means for switching the connection state of an output of said first amplifier means and said first and second buffer means;
(d) second switch means for obtaining a bias to be fed back to said first amplifier means selectively from said first and second buffer means and feeding back said obtained bias selectively to said first amplifier means;
(e) means for supplying an output of said first buffer means to a first load; and
(f) means for supplying an output of said second buffer means to a second load.

14. An apparatus according to claim 16, further comprising:
(f) means for supplying an output of said first buffer means to a first load; and
(g) means for supplying an output of said second buffer means to a second load.

* * * * *